United States Patent [19]
Akamatsu et al.

[11] Patent Number: 5,162,642
[45] Date of Patent: Nov. 10, 1992

[54] DEVICE FOR DETECTING THE POSITION OF A SURFACE

[75] Inventors: Takahiro Akamatsu, Machida; Haruna Kawashima; Hiroyoshi Kubo, both of Kawasaki, all of Japan

[73] Assignee: Canon Kabushiki Kaisha, Tokyo, Japan

[21] Appl. No.: 657,950

[22] Filed: Feb. 21, 1991

Related U.S. Application Data

[63] Continuation of Ser. No. 532,226, Jun. 5, 1990, abandoned, which is a continuation of Ser. No. 361,681, May 31, 1989, abandoned, which is a continuation of Ser. No. 319,879, Mar. 1, 1989, abandoned, which is a continuation of Ser. No. 241,838, Sep. 6, 1988, abandoned, which is a continuation of Ser. No. 931,997, Nov. 18, 1986, abandoned.

[30] Foreign Application Priority Data

| Nov. 18, 1985 | [JP] | Japan | 60-256722 |
| Dec. 16, 1985 | [JP] | Japan | 60-281124 |
| Dec. 16, 1985 | [JP] | Japan | 60-281125 |
| Dec. 16, 1985 | [JP] | Japan | 60-281126 |

[51] Int. Cl.$^5$ .................................. G01J 1/20
[52] U.S. Cl. ................... 250/201.6; 250/561; 356/376
[58] Field of Search ........... 250/201 AF, 204, 548, 250/557, 560, 561, 225, 201.6; 356/1, 4, 376, 381, 382, 369, 375, 376

[56] References Cited

U.S. PATENT DOCUMENTS

| 4,230,940 | 10/1980 | Minami et al. | 250/201 |
| 4,373,816 | 2/1983 | Laib | 356/375 |
| 4,395,117 | 7/1983 | Suzuki | 250/557 |
| 4,531,833 | 7/1985 | Ohtomo | 356/4 |
| 4,558,949 | 12/1985 | Uehara et al. | 356/375 X |
| 4,570,059 | 2/1986 | Iijima | 250/201 AF |
| 4,589,773 | 5/1986 | Ido et al. | 356/376 X |
| 4,639,140 | 1/1987 | Lerat | 356/375 X |
| 4,647,209 | 3/1987 | Neukomm et al. | 356/376 |
| 4,705,940 | 11/1987 | Kohno | 250/201 |
| 4,748,333 | 5/1988 | Mizutani et al. | 250/561 |

FOREIGN PATENT DOCUMENTS

| 56-42205 | 4/1981 | Japan . |
| 57-60205 | 4/1982 | Japan . |
| 0054908 | 3/1984 | Japan | 356/375 |
| 59-188931 | 10/1984 | Japan . |

Primary Examiner—David C. Nelms
Attorney, Agent, or Firm—Fitzpatrick, Cella, Harper & Scinto

[57] ABSTRACT

A surface position detecting device usable with a semiconductor device manufacturing exposure apparatus having a projection lens system for projecting an image of a pattern of a mask onto a semiconductor wafer. The device is arranged to detect the position of the wafer relative to an image plane of the projection lens system, into which plane the wafer is to be positioned. The device includes a sensor for sensing light reflected by the wafer thereby to detect the position of the wafer. Also, in order to avoid detection errors due to interference of light caused by a resist layer formed on the wafer, the wafer is irradiated with different wavelengths of lights from plural light sources. In one aspect, the device uses a reference light which is directed to the sensor without reflection by the wafer in order to avoid an effect of drift of the sensor.

11 Claims, 6 Drawing Sheets

DEVICE FOR DETECTING THE POSITION OF A SURFACE

This application is a continuation of application Ser. No. 07/532,226 filed Jun. 5, 1990, now abandoned, which is a continuation of application Ser. No. 07/361,681 filed May 31, 1989, now abandoned, which is a continuation of application Ser. No. 07/319,879 filed Mar. 1, 1989, now abandoned, which is a continuation of application Ser. No. 07/241,838 filed Sep. 6, 1988, now abandoned, which is a continuation of application Ser. No. 06/931,997 filed Nov. 18, 1986, now abandoned.

FIELD OF THE INVENTION AND RELATED ART

This invention relates to a device detecting the position of a surface of an object and, more particularly, to a device for detecting positional deviation of a surface of an object from a reference plane. The device of the present invention is suitably usable, e.g., in an automatic focus controlling system which is employed in a step-and-repeat type exposure apparatus for use in the manufacture of semiconductor devices for photolithographically transferring images of a pattern of a reticle onto the surface of a semiconductor wafer in a reduced scale and in a step-and-repeat manner, in order to detect positional deviation between the wafer surface and a plane in which the image of the pattern of the reticle is formed.

Reduction projection type exposure apparatuses have conventionally employed a surface position detecting system wherein a light beam is projected onto the surface of a wafer along an inclined direction with respect to the wafer surface and the amount of positional deviation of the light reflected from the wafer surface with respect to a predetermined reference position is detected by means of a sensor, whereby the position of the wafer surface is detected. According to this technique, such shot area on the wafer onto which the pattern of the reticle is just going to be photoprinted can be directly subjected to the position detection (focus detection). Also, the position detection itself can be made quickly. With this technique, however, there is a possibility that a photoresist coating formed on the wafer causes optical interference between the light reflected by the surface of the resist coating (resist layer) and the light reflected by the surface of a substrate of the wafer, with the result that the accuracy of position detection is degraded. Further, it is possible that, due to changes in temperature and/or humidity, the output of the position detecting sensor drifts and, as a result of which, the accuracy of position detection is degraded.

SUMMARY OF THE INVENTION

It is accordingly a primary object of the present invention to provide a surface position detecting device by which the position of a surface of an object can be accurately detected with the use of light.

It is another object of the present invention to provide a surface position detecting device which is suitably usable as an automatic focus detecting device, to be used in a projection type exposure apparatus including a projection optical system for photolithographically transferring a pattern of a mask or reticle onto the surface of a semiconductor wafer, for accurately positioning the wafer surface in an image plane of the projection optical system.

Briefly, according to one aspect of the present invention, there is provided a device for detecting a position of a surface, said device comprising: projecting means having a plurality of light-emitting means for producing light of different wavelengths and for directing the light toward the surface, being examined, along an inclined direction with respect to the surface being examined; light receiving means for receiving light reflected from the surface and for producing an electric signal corresponding to a position of reception of the light; and processing means for receiving the signal outputted from said light receiving means and for detecting positional deviation of the surface, being examined, from a predetermined reference plane on the basis of the signal outputted from said light receiving means.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
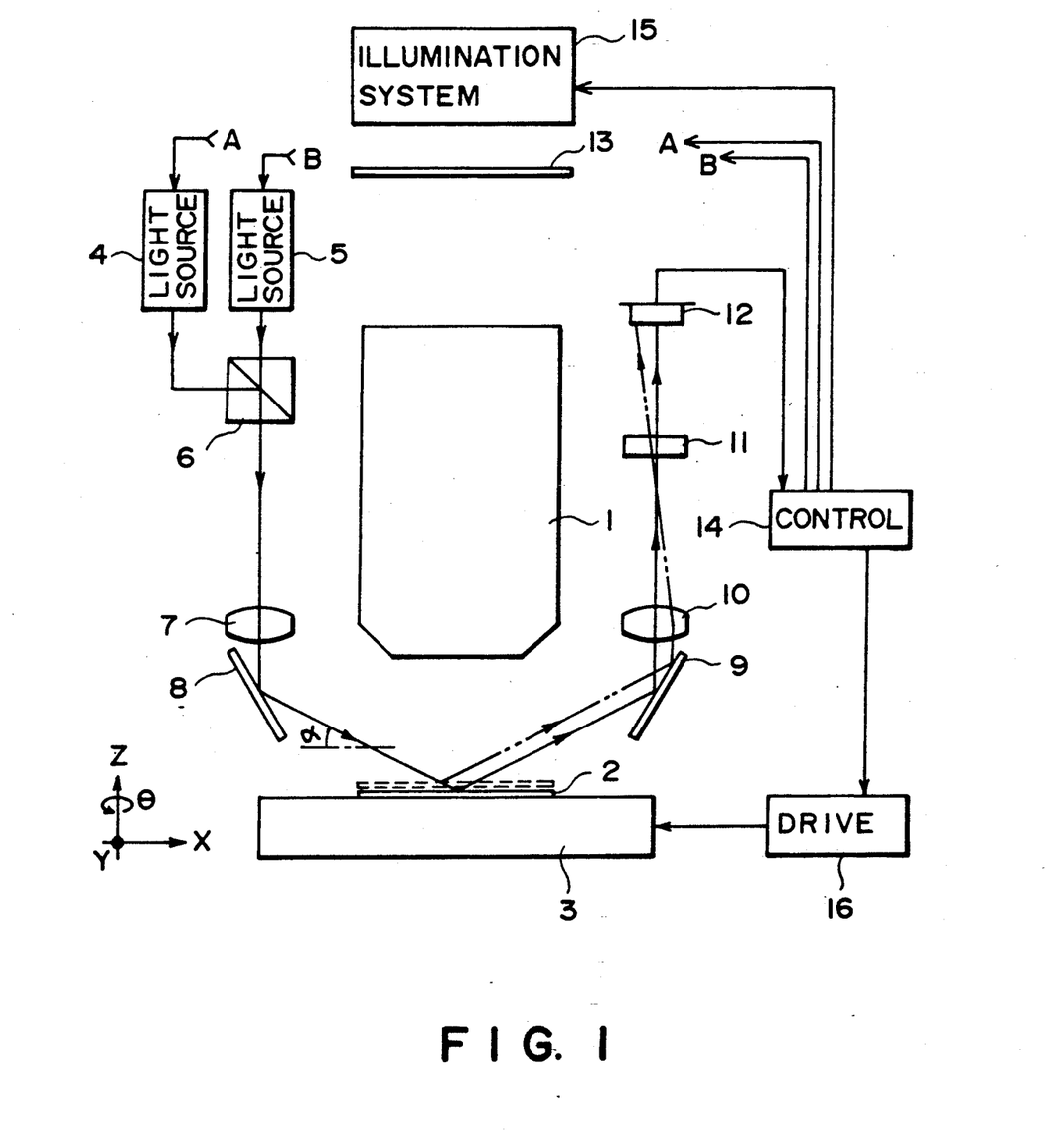
FIG. 1 is a schematic view of a projection type exposure apparatus into which an automatic focus controlling system, using one embodiment of the present invention, is incorporated.
Figure 7:
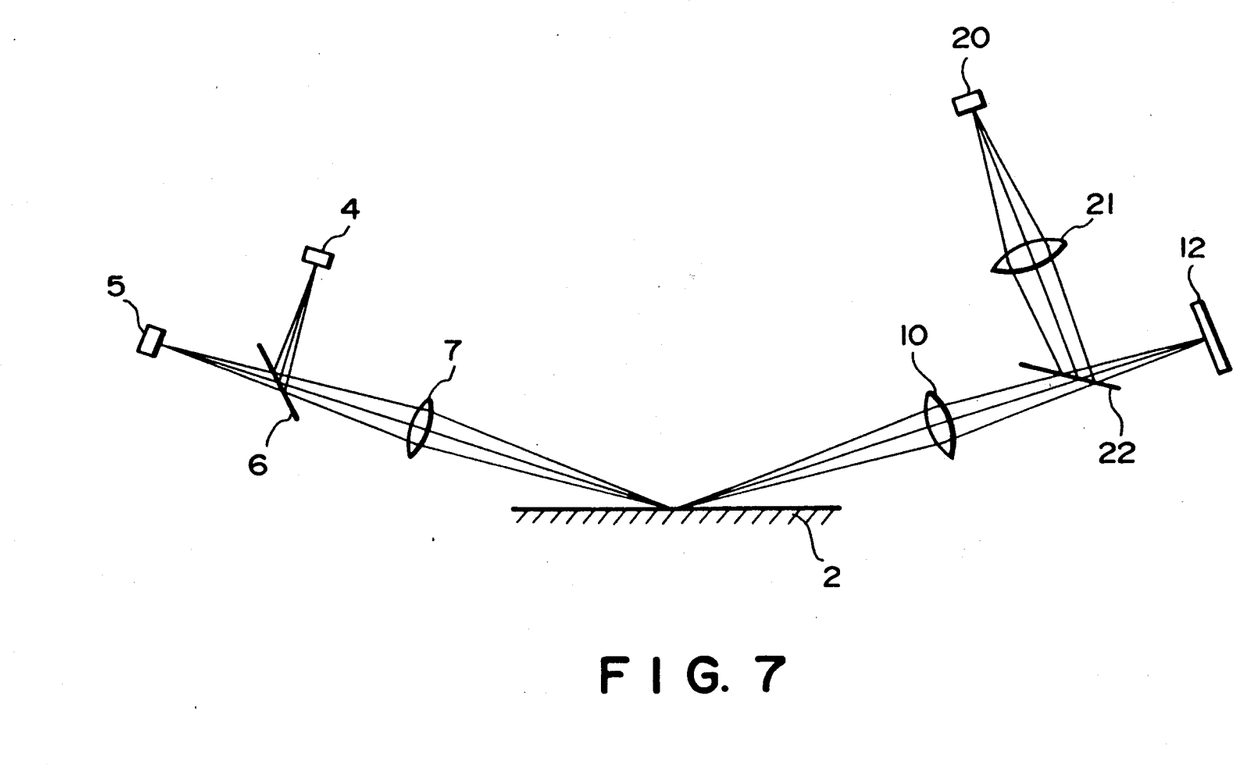
FIG. 7 is a schematic view showing an imaging relation between optical components of the automatic focus controlling system of the FIGS. 1 and 4 embodiments.

Referring first to FIG. 1, there is shown an arrangement of an automatic focus controlling system used in a reduction projection type exposure apparatus, according to one embodiment of the present invention. As shown in FIG. 1, the projection exposure apparatus includes a reduction projection lens system 1 having an optical axis which extends in parallel to a Z axis of an X-Y-Z coordinate system. Disposed underneath the projection lens system 1 is a semiconductor wafer 2. The wafer 2 is placed on a wafer stage 3 which is movable in a plane containing X and Y axes and along the Z axis. The automatic focus controlling system has an optical system which includes a plurality of light sources such as at 4 and 5 in FIG. 1. For the sake of simplicity of illustration, only two light sources are shown in FIG. 1. These light sources are adapted to produce lights of different wavelengths. For these light sources, light emitting diodes or lasers, each producing light of a predetermined wavelength or wavelength range, may be used. The light (position detecting light) emitted from each of the light sources 4 and 5, in this embodiment, is incident on a beam splitter 6 (which may be a half mirror), whereby one and the same optical path is defined after the beam splitter 6. Along this optical path, the light from the sources 4 and 5 advances and enters into a lens system 7. After passing the lens system 7, the light is reflected by a mirror 8 toward the wafer 2 and it is concentrated or imaged upon a reflection point on the wafer 2, such as illustrated in FIG. 7.

In the present embodiment, at this time, the angle of incidence of the position detecting light upon the wafer 2 is determined so as to be greater than 80 degrees. In other words, the position detecting light is projected so that the angle α defined between the wafer 2 and the light incident thereon becomes not greater than 10 degrees. Also, as for the position detecting light, a light which is S-polarized light with respect to the surface of the wafer 2 is used. This is very effective because, with this arrangement, such component of the light from the wafer 2 that is reflected by the surface of the resist layer formed on the substrate of the wafer becomes prevailing as compared with such component of the light from the wafer 2 that is reflected by the surface of the substrate of the wafer. Consequently, the effect of the component reflected by the wafer substrate upon the accuracy of position detection can be suppressed sufficiently.

The light reflected by the wafer 2 is then reflected by a mirror 9 toward a lens system 10. After passing the lens system 10, the light enters into a polarizing plate 11 (which may be a polarization beam splitter) and, thereafter, it is incident and concentrated (imaged) upon a position sensor diode 12 (which may be a photosensor having divided light receiving surface), such as shown in FIG. 7.

The polarizing plate 11 is adapted to extract substantially only the S-polarized component of the light from the wafer 2, with the result that substantially only such component reaches the position sensor diode 12. This is very effective because the proportion of the component of light reflected from the wafer substrate can be further reduced.

Denoted in FIG. 1 by numeral 13 is a mask on which a circuit pattern for the manufacture of semiconductor devices, in this embodiment, is formed. The mask 13 is illuminated by an illumination system 15 when the pattern formed thereon is to be transferred onto the wafer 2. At the time of such pattern transfer, an image of the pattern of the mask 13 is projected by means of the projection lens system 1 onto the wafer 2 in a reduced scale. Each time the wafer 2 is exposed to the pattern of the mask 13 with light passed through the mask 13, the wafer stage 3 moves stepwise along the X-Y plane by a predetermined amount in order that different portions or different shot areas on the wafer 2 are displaced sequentially to a position at which the image of the pattern of the mask 13 is projected by the projection lens system 1. Such movement of the wafer stage 3 is carried out by a driving unit 16 under the influence of instruction signals supplied thereto from a control unit 14. In addition to the control of the driving unit 16, the control unit 14 controls the irradiation of the mask 13 by use of the illumination system 15 thereby to control the step-and-repeat exposure operation as a whole to be made in the exposure apparatus.

Further, the control unit 14 is arranged to compute or calculate the amount of positional deviation, in the direction of the Z axis, of the wafer 2 surface with respect to the focus position of the projection lens system 1 (i.e. the position at which the image of the pattern of the mask 13 is formed by the projection lens system 1). The control unit 14 effects this calculation in response to outputs of the position sensor 12 and during a time period between the stepwise movement of the wafer stage 3 and the exposure of the wafer 2 to the mask 13 pattern with the light from the illumination system 15. Also, the control unit 14 produces and supplies an instruction signal to the driving unit 16 in accordance with the result of calculation. In response to the instruction signal supplied from the control unit 14, the driving unit 16 drives the wafer stage 3 in the direction of the Z axis so that the wafer 2 surface is accurately positioned in the image plane of the projection lens system 1. Such Z-axis position adjustment of the wafer 2 is carried out prior to the initiation of the exposure operation related to a particular shot area with respect to which the Z-axis position adjustment is just to be executed. Energization and de-energization of the light sources 4 and 5, for the sake of position detection by the position sensor 12, are controlled by the control unit 14.

In the automatic focus controlling system of the present embodiment, the point on the wafer 2 at which the light from the sources 4 and 5 is reflected and the point on the position sensor 12 at which the light from the wafer 2 is incident upon the sensor 12, are held in an imaging relation (optically conjugate relation) such as seen in FIG. 7 with the aid of a depth of focus defined by the lens systems 7 and 10, provided that the wafer 2 position is included in a position detecting range. By this, any positional deviation of the wafer 2 with respect to the direction of the Z axis can be detected from the position of incidence of the light upon the position sensor 12 in the direction of the X axis, such that the positioning of the wafer 2 with respect to the focal point position of the projection lens system 1 is controlled in accordance with the detection. More particularly, in the device of the present embodiment, when the wafer 2 is just at an in-focus position of the projection lens system 1 such as depicted by a solid line in FIG. 1, the light emitted from the light sources 4 and 5 and projected on the wafer 2 by way of the mirror 8 is reflected by the wafer 2, in the manner as depicted by a solid line, toward the mirror 9. After being reflected by the mirror 9, the light from the wafer 2 passes through the lens system 10 and the polarizing plate 11 and finally is incident on the position sensor 12 substantially at the center of its light-receiving surface. When, on the other hand, the wafer 2 is at a broken-line position (far-focus position), the light from the sources 4 and 5 is reflected by the wafer 2 in the manner as depicted by a phantom line so that it is incident on the position sensor 12 at a left-hand end position of the light-receiving surface of the sensor 12, is viewed in FIG. 1. If, to the contrary, the wafer 2 is at a near-focus position, the light reflected from the wafer 2 is incident on the sensor 12 at aright-hand end of its light-receiving surface. The position of incidence of light upon the light-receiving surface of the position sensor 12 is thus in a substantially proportional relation with the position of the wafer 2 surface with respect to the direction of the Z axis. Therefore, on the basis of the position of incidence of light upon the position sensor 12, the amount of positional deviation of the wafer 2 with respect to the focal point position of the projection lens system 1 can be detected.

As for the factors which may cause errors in the detection of positional deviation with the use of the focusing state detecting system of the type described above, inclination of the wafer with respect to the Z axis as well as the effect of a light-transmissible material which is provided on the wafer as the "resist layer", should be considered. The former, i.e.. inaccurate detection due to the inclination of the wafer can be obviated, in principle, by arranging the system so as to establish an imaging relation between the reflection point on the wafer 2 and the point of incidence of light upon the position sensor 12 such as described in the foregoing.

As for the latter, on the other hand, the presence of the resist layer leads to a possibility of occurrence of optical interference between the light reflected by the surface of the resist layer and the light reflected from the substrate of the wafer. Such interference appears in the form of deviation of a "center of gravity" of the intensity of the light imaged on the position sensor 12. This means that the "position" detected by the position sensor 12 is variable depending on the thickness of the resist layer or, alternatively, the wavelength of light used as the position detecting light.

It is seen from the above that, to assure high-accuracy position detection, it is desirable to avoid the effect of interference of the position detecting light due to the presence of the resist layer.

Figure 2:
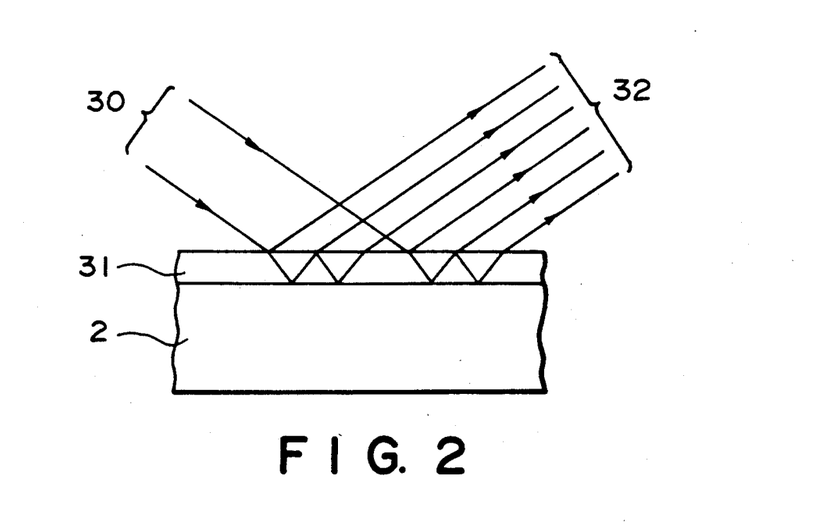
FIG. 2 is a sectional view schematically showing the state of reflection of light at the surface of a resist layer and the surface of a substrate of a wafer, when position detecting light is incident on the wafer with a small angle.

Referring now to FIGS. 2 and 3, the manner of avoiding inaccurate detection resulting from the effect of interference of the position detecting light due to the presence of the resist layer will be described.

FIG. 2 is a schematic view showing, in an enlarged scale, the reflection point on the wafer 2. The wafer 2 comprises a substrate coated with a photoresist material which is substantially transparent. Thus, a resist layer 31 is formed on the wafer 2 substrate. The flux of light from the light sources 4 and 5 (FIG. 1) impinges on the wafer so that a beam spot of constant diameter is defined thereon. Within this beam spot, the intensity of the light flux 30 is substantially uniform. Also, as will be readily understood from FIG. 7, the light flux 30 is imaged when it is incident on the wafer. The light beams incident on the wafer is reflected by the surface of the resist layer 31 and the surface of the substrate 2 of the wafer, respectively, such that a light flux 32 defined by the reflection at the wafer has an intensity distribution which is not uniform. In the schematic view of FIG. 2, only chief rays of the light flux are illustrated. FIGS. 3A-3D are graphs each showing an intensity distribution of the light flux 32, comprising light rays reflected from the surface of the resist layer 31 and the surface of the substrate 2 of the wafer, at the time when it is imaged on the position sensor 12 by means of the optical system 10. The intensity distribution is depicted while taking, as an origin O, the point on the sensor 12 on which the lowermost chief ray of the light flux 32 as viewed in FIG. 2 is incident.

When the light flux 30 is projected on the wafer along an inclined direction with respect to the wafer 2 surface, the light flux 30 is divided into a component reflected by the surface of the resist layer 31 and a component transmitted by the resist layer 31. The transmitted-light component is subjected to multiple reflection between the surface of the substrate of the wafer 2 and the surface of the resist layer 31 and, finally, all the transmitted-light component emerges out of the resist layer 31.

Figure 3A:
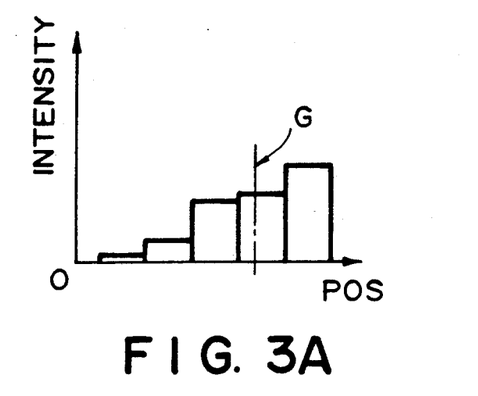
FIGS. 3A, 3B, 3C and 3D are graphs, respectively, showing examples of intensity distribution of light reflected from the wafer and incident upon a position detecting photosensor.
Figure 3B:
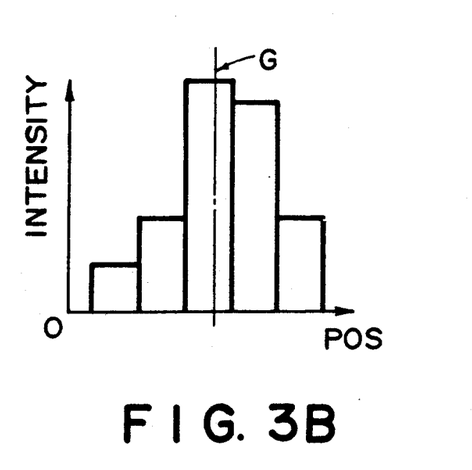
Figure 3C:
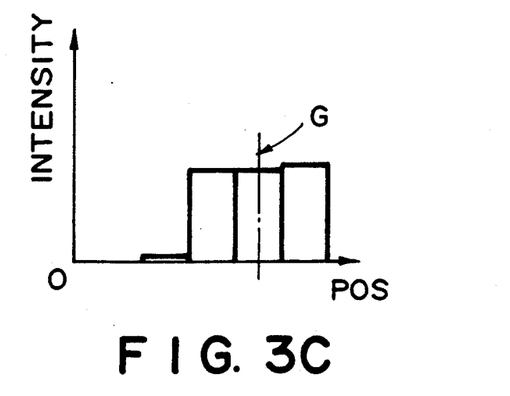

The light component reflected by the surface of the resist layer 31 and the light component reflected by the surface of the substrate of the wafer are combined with each other, whereby the light flux 32 having a non-uniform intensity distribution such as shown in FIG. 3A, for example, is formed. The thus formed light flux 32, after being reflected by or transmitted through the mirror 9, the lens system 10 and the polarizing plate 11 shown in FIG. 1, is imaged on the position sensor 12. The graph of FIG. 3A shows the intensity distribution as observed on the position sensor 12 when a certain wavelength $\lambda 1$ is used as the position detecting light. On the other hand, the graph of FIG. 3B and the graph of FIG. 3C show intensity distributions, respectively, as observed on the position sensor 12 when wavelengths $\lambda 2$ and $\lambda 3$, which are different from each other, are used as the position detecting light, respectively. Also, the graph of FIG. 3D shows an intensity distribution of the position sensor 12 when different wavelengths $\lambda 1 - \lambda n$ are used at a time as the position detecting light.

Where a light source which produces monochromatic or semi-monochromatic light is used, the intensity distribution detected by the position sensor 12 shows a complicated pattern such as illustrated in FIGS. 3A-3C. This is because of the interference between the light component reflected by the surface of the resist layer 31 and the light component reflected by the surface of the substrate of the wafer. Further, as will be understood from FIGS. 3A-3C, the intensity distribution of the light is variable depending on the wavelength used. Also, the intensity distribution is changeable depending on the thickness of the resist layer 31.

When a particular intensity distribution is detected, the "center of gravity" of the intensity distribution as denoted at G is determined as the "position" of the wafer. Thus, the position sensor 12 outputs a position signal on the basis of the determined "center of gravity" G of the intensity distribution. Since, however, the state of interference by the resist layer 31 is changeable in accordance with the wavelength of light used and the thickness of the resist layer 31, the position of the center of gravity G is changeable accordingly, which leads to inaccurate detection.

Figure 3D:
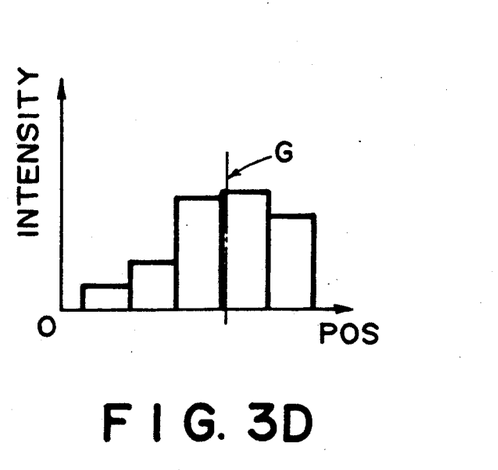

As a result of experiments, the inventors of the subject application have found that, where a plurality of light sources each producing monochromatic or semi-monochromatic light is used, i.e., when light source means providing different wavelengths is used, for the sake of position detection, the intensity distribution upon the position sensor 12 becomes regular such as shown in the graph of FIG. 3D. That is, by use of light having different wavelengths, the effect of interference due to the presence of the resist layer is averaged and the position of the center of gravity G of the intensity distribution is substantially constant independently of the thickness of the resist layer. On the basis of this finding, the present invention uses light source means which provides different wavelengths. By doing so, the errors in the position detection due to the presence of the resist layer when the surface position of the wafer is to be detected optically, can be obviated substantially fully.

For the reason described above, the embodiment of FIG. 1 uses plural light sources, such as at 4 and 5, for producing lights of different wavelengths. As a matter of course, each of these wavelengths is one to which the photoresist material applied to the wafer is not sensitive. In addition thereto, the system is arranged so that the light is incident on the wafer 2 with an angle λ not greater than 10 degrees with respect to the wafer 2. Further, the light impinging on the wafer comprises an S-polarized light with respect to the plane of the wafer 2. With this arrangement, the light component reflected by the surface of the substrate of the wafer is reduced, with the result that the accuracy of position detection is improved more significantly.

The averaging of the effect of interference by the resist layer is attainable by projecting, at a time, lights of different wavelengths onto the wafer and by detecting the light reflected from the wafer. However, irradiation of the wafer with lights of different wavelengths may be effected in a time-sharing fashion. That is, the projection of the lights of different wavelengths may be effected sequentially so that, after being reflected by the wafer, they are detected independently of each other. By processing the signals which are obtained at the position sensor in sequence, the averaging of the effect of interference is attainable. Particularly, with the latter method, inaccuracy in the position detection resulting from the difference or non-coincidence with respect to the optical path defined for each of the different wavelengths of lights due to any error in the adjustment of the optical system, can be corrected. For this purpose, as an example, a reference wafer having no resist layer may be used and the position of incidence of light upon the position sensor may be preparatorily measured for each of the lights of different wavelengths. Then, while taking the positions of incidence of lights as reference positions, actual detection of the wafer surface position may be executed.

Figure 4:
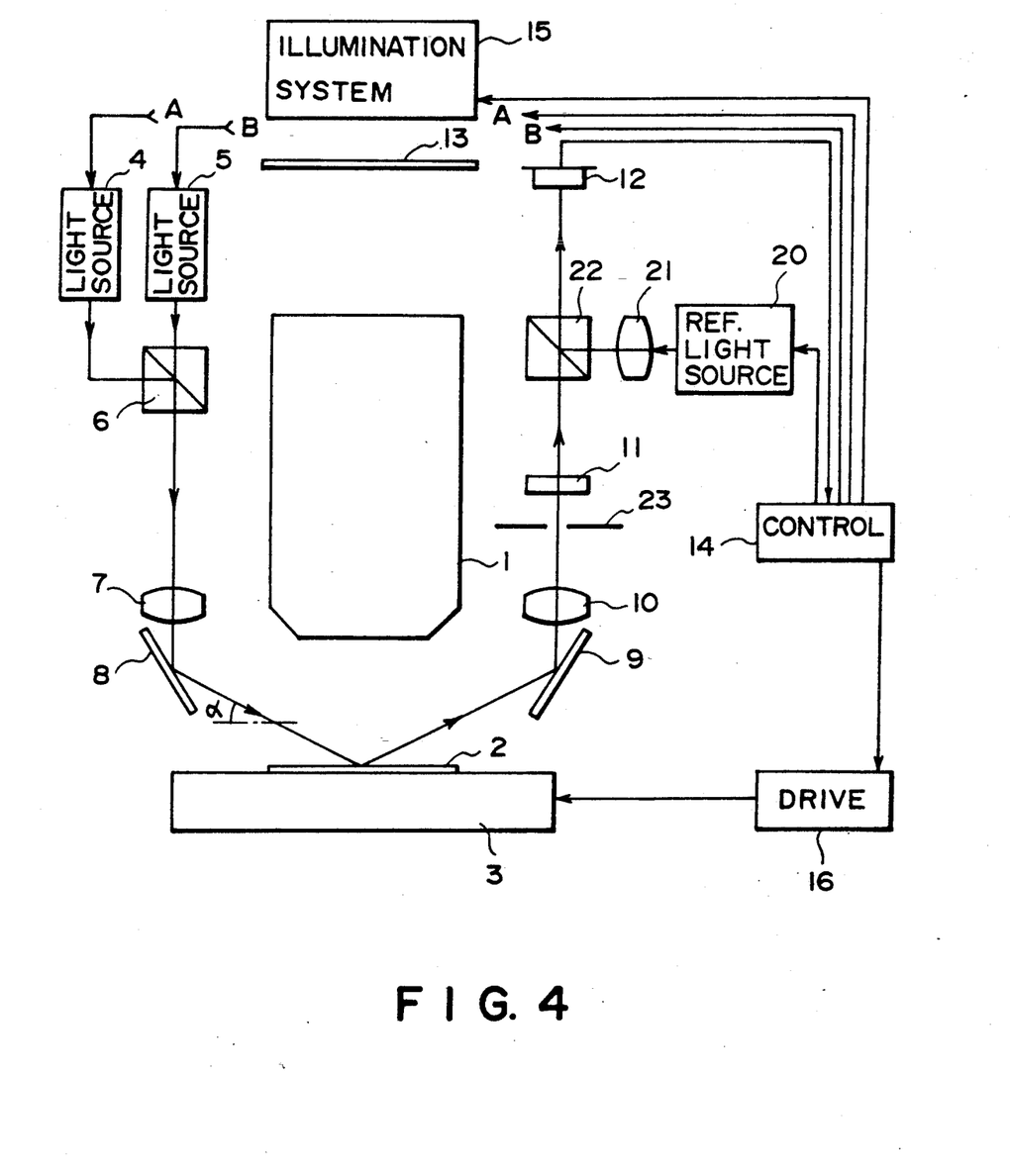
FIG. 4 is a schematic and diagrammatic view of a projection type exposure apparatus into which an automatic focus controlling system, using another embodiment of the present invention, is incorporated.

In the embodiment described hereinbefore, a light emitting diode or a laser may be used as each of the light sources. Also, as for the position sensor, any photoelectric converting element having a capability of position detection, such as a position sensing device (PSD), a photosensor having a divided sensing region, a charge coupled device (CCD), etc., is usable.

Where a position sensing device is used, a reference signal detecting system such as shown in FIG. 4 is preferably employed in order to avoid inaccurate detection of a position signal, resulting from changes, with time, of a reference point on the position sensing device. This will now be described in detail.

In FIG. 4, the light emitted from a reference light source 20 enters a lens system 21 and then is incident on a beam splitter 22 (which may be a half mirror). By this beam splitter 22, the light is deflected so that it is imaged on a position sensor 12, such as illustrated in FIG. 7.

In this embodiment, when the device is adjusted at the time of assembling thereof, the optical axis of the optical system and the reference point on the position sensor 12 are adjusted so that the position signal, which is obtainable from the position sensor 12 in response to reception of light from the reference light source 20 and light from plural position-detecting light sources such as at 4 and 5 in FIG. 4, becomes or designates "zero".

When, in operation of the FIG. 4 embodiment, the wafer 2 is actually to be positioned in the focal plane of the projection lens system 1, the reference light source 20 is first energized to emit light and the position signal corresponding thereto is detected preparatorily. Namely, even if the reference point on the position sensor 12 is displaced by Δ, with aging, from its initial position established at the time of initial adjustment, such deviation Δ of the reference point of the position sensor 12 can be measured by detecting the position signal produced in response to emission of light from the reference light source 20. This preparatory detection is effected prior to detection of light with reference to the wafer 2.

After completion of detection of the change Δ in the reference point of the position sensor 12, a position signal S produced in response to irradiation of the wafer 2 with the position detecting lights, is detected. In this embodiment, the deviation Δ of the reference point and the position signal S are detected at a time interval which is sufficiently short so that substantially no deviation of the reference point of the position sensor 12 occurs during this time period. The detected position signal S contains a component corresponding to the deviation Δ of the reference point, with aging, of the position sensor 12. Therefore, by subtracting, from the signal S, the position signal Δ obtained by the light emission of the reference light source 20, the position of the wafer can be detected very accurately. In other words, by controlling the focus position detecting system with use of a position signal $(S-\Delta)$, high-accuracy focusing with excluding the effect of the deviation of the reference point of the portion sensor 12, with aging, is ensured.

Further, in accordance with the present embodiment, a stopper 23 is provided at a position spaced from a principal point, on the sensor 12 side, of the lens system 10 by a distance corresponding to the focal length of the lens 10. The stopper 23 is provided in order to block higher-order diffraction components of the light reflected from the surface of the resist layer on the wafer 2 on which wafer one or more patterns have already been formed. This is very effective because, when the position detection is executed to a wafer having pattern or patterns, the intensity distribution on the position sensor is not affected by the higher-order diffraction components with the result that the center of gravity of the intensity distribution does not change. Therefore, high-accuracy position detection is assured with reference to wafers having patterns. The structure and function of the remaining portion of the FIG. 4 embodiment is essentially the same as that of the corresponding portion of the FIG. 1 embodiment.

Figure 5:
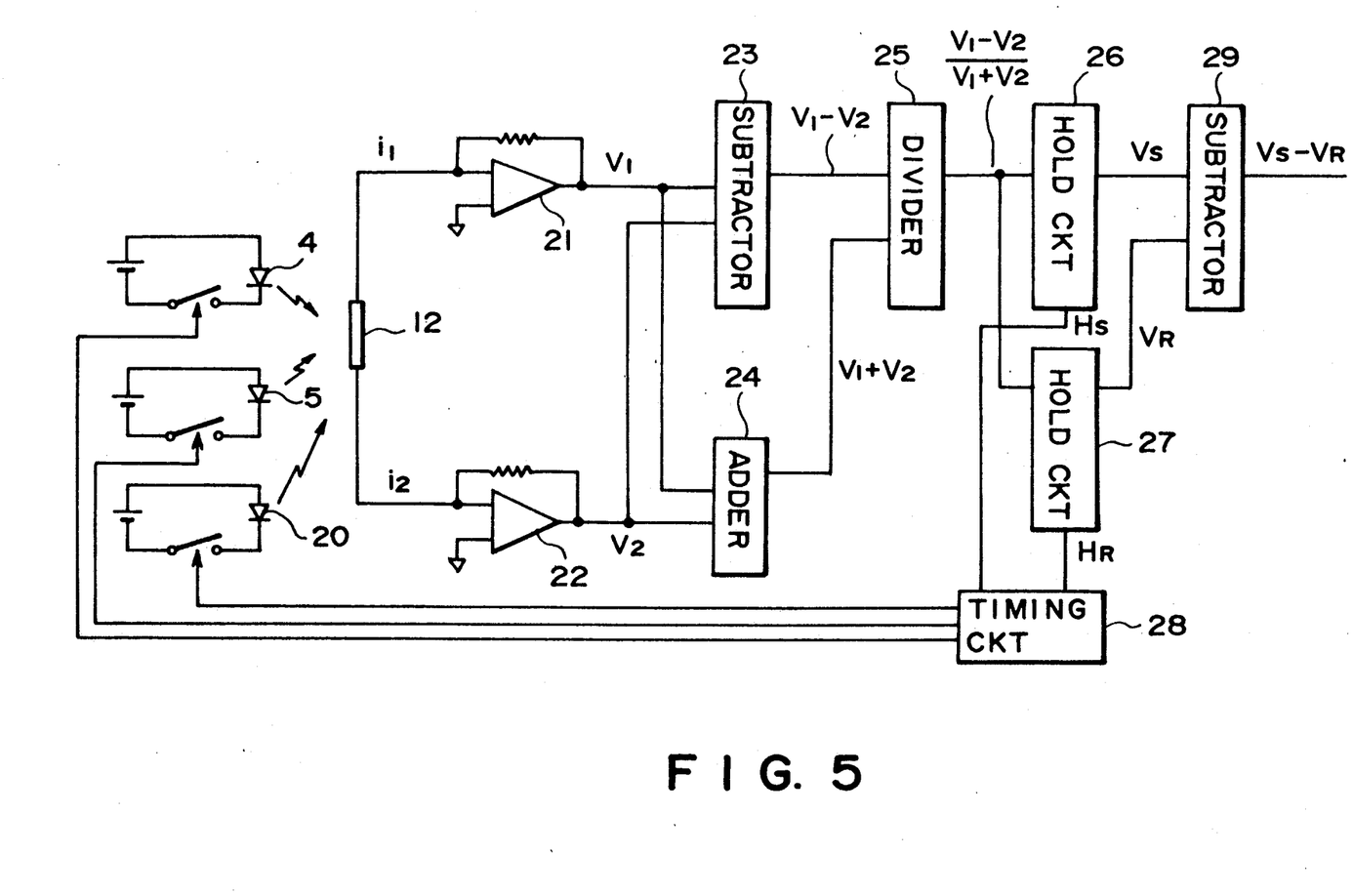
FIG. 5 is a diagram of a signal processing circuit used in the apparatus of FIG. 4.

Referring now to FIG. 5, the manner of correcting changes with aging (i.e. drift) of the output of the position sensor 12 in the embodiment of FIG. 4 will be described in detail.

Figure 6:
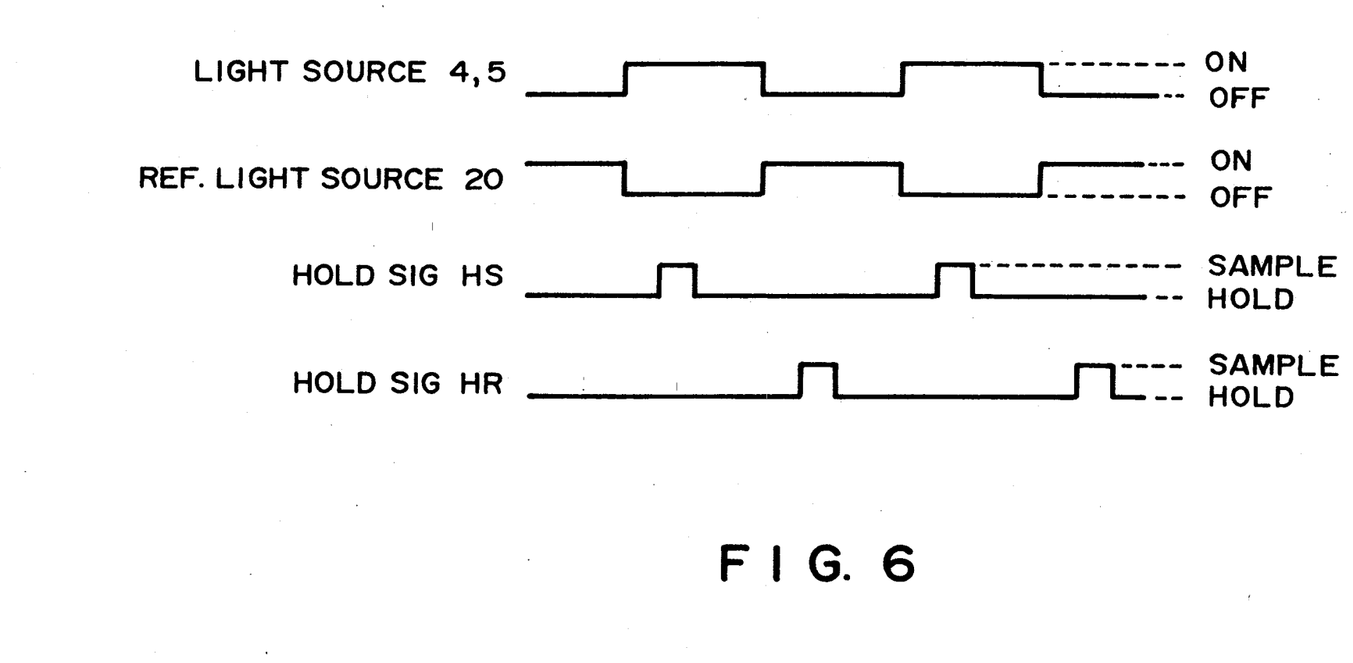
FIG. 6 is a chart showing operational timing according to which the signal processing circuit of FIG. 5 operates.

FIG. 5 is a diagram showing a signal processing circuit employed in the embodiment of FIG. 4. Electric currents I1 and I2 are outputted from the position sensor 12 in accordance with the position of the beam spot formed thereon. These electric currents are converted into electric voltages V1 and V2 by means of preamplifiers 21 and 22. Both of the electric voltages V1 and V2 are supplied to a subtractor 23, whereby a signal corresponding to "V1-V2" is produced. Simultaneously, both of the electric voltages V1 and V2 are applied to an adder 24, whereby a signal corresponding to "V1+V2" is produced. Then, the signal "V1-V2" obtained by the subtraction is divided by the signal "V1+V2" obtained by the addition, whereby a normalized or standardized position signal, i.e., "(V1-V2)/(V1+V2)" is outputted from a divider 25. The output signal of the divider 25 is inputted into each of holding circuits 26 and 27. The changeover of sampling/holding in each of the circuits 26 and 27 is carried out in accordance with timing signals produced from a timing circuit 28. More particularly, when the light source 4 and/or the light source 5 is being energized, a wafer position signal VS from the divider 25 in response to irradiation of the wafer with the light from the light source 4 and/or 5, is held by the holding circuit 26. When, on the other hand, the reference light source 20 is being energized, a reference position signal VR from the divider 25 produced in response to emission of light from the source 20, is held by the holding circuit 27. The timing for such changeover is illustrated in FIG. 6.

The outputs VR and VS of the holding circuits 26 and 27 are applied to a subtractor 29, whereby a position signal "VS-VR" concerning the position of the surface, being examined with the light from the source 4 and/or 5, is finally obtained.

Advantageous features of the signal processing according to the signal processing system of FIG. 5, will now be described in detail.

The wafer position signal detected by use of the light from the light source 4 and/or 5, is supplied to the holding circuit 26 as the signal "VS". This signal "VS" contains a "drift voltage component" which results from drifting of the position sensor 12 output due to changes in temperature, humidity and/or the like. If the magnitude of such drift voltage component is represented by "VD", the wafer position signal is actually composed of "VS'+VD". Therefore, if the focal point is detected by using such signal as the wafer position signal, a position which is deviated from an actual focal point position by an amount "VD" is discriminated as being the focal point.

In view of the foregoing, according to the present embodiment, the optical axis defined by the reference light source 20 as well as the holding circuit 27 are preparatorily adjusted so that the light from the reference light source 20 is incident on the reference position and that, at a predetermined temperature and humidity, the output "VR" of the holding circuit 27 responsive to the irradiation by the light source 20 becomes "zero". Also, the optical axis defined by the light source 4 and/or 5 as well as the holding circuit 26 are preparatorily adjusted so that the wafer position signal obtained in response to irradiation by the light source has a value corresponding to the actual position of the wafer.

Where the position sensor 12 drifts, the output from the holding circuit 27 corresponding to the reference position does not show "zero", but has a value "VR". And, at this time, the wafer position signal is composed of "VS'+VR". Accordingly, when these two signals are processed by the subtracting circuit 29, the resultant signal is composed of:

$$(VS'+VR)-(VR)=VS'$$

Thus, what is outputted from the subtractor 29 is a that obtained by excluding the effect of the magnitude of the drift VR from the wafer position signal "VS'+VR" containing the amount of drift. In this manner, the effect of the drift of the position sensor 12 is excluded, whereby correct and accurate detection of the wafer position is always assured.

Also, it is possible that the voltage "VD" contains a drift component of the signal processing circuit itself, comprising the preamplifiers 21 and 22, the subtractor 23, the adder 24 and the divider 25, in addition to the drift component of the position sensor 12. With the present embodiment as described above, all of the effects of these drift components can be avoided.

In the present embodiment, the correction of the drift of the position sensor 12 is executed while energizing the reference light source 20 and the position detecting light source 4 and/or 5 in a time sharing fashion. Since, however, the drift of the position sensor 12 is very gradual, the system may be arranged such that, prior to detection of the wafer position, the reference light is irradiated and the degree of drift of the sensor is detected. And, the detected drift of the sensor 12 is used at the time of detection of the wafer position as the correction factor. Also, in this embodiment, the energization and de-energization of the light sources 4, 5 and 20 are controlled by means of respective switching circuits which are operable independently from each other. However, where it is desired to control energization/de-energization of the light sources 4 and 5 at the same timing, a common switching circuit may be used to control the energization/de-energization of the light sources 4 and 5.

In accordance with the present invention, which has hitherto been described, a plurality of light sources producing different wavelengths are used. This effectively prevents or suppresses inaccuracies in the position detection resulting from the interference of the position detecting light, when the position detection is to be executed to an object having plural reflecting surfaces such as a semiconductor wafer to which a resist material is applied. Thus, the surface position of an object such as the wafer can be detected very accurately and with good reproducibility.

Further, in accordance with another aspect of the present invention, a reference light is used to avoid the effect of the drift of the position sensor and/or the signal processing system. Therefore, high-accuracy detection of focal point position is assured stably.

It will be understood that the device of the present invention is suitably and effectively usable for the purpose of focusing of a reduction projection lens system in a reduction projection type exposure apparatus wherein particularly high-accuracy focus detection is required. When the present invention is incorporated into such apparatus, the accuracy of focus detection is improved very significantly. Therefore, high-resolution pattern transfer is attainable, with the result that higher-capacity and higher-density circuit devices can be manufactured.

While the invention has been described with reference to the structures disclosed herein, it is not confined to the details set forth and this application is intended to cover such modifications or changes as many come within the scope of the following claims.

What is claimed is:

1. A device for detecting a position of a surface, said device comprising:
    projecting means having a plurality of light-emitting means for producing light of different wavelengths and for directing the light toward the surface, being examined, along an inclined direction with respect to the surface being examined;
    light receiving means for receiving light reflected from the surface and for producing an analog electric signal corresponding to a position of reception of the light;
    light source means for projecting reference light onto a reference position on said light receiving means, separately of the light reflected from the surface being examined; and
    processing means for receiving the signal outputted from said light receiving means in response to reception of the light reflected from the surface and the signal outputted from said light receiving means in response to reception of the reference light, and for detecting positional deviation of the surface, being examined, from a predetermined reference plane on the basis of the outputs from said light receiving means.

2. A device according to claim 1, wherein said projecting means includes a first optical system adapted to define substantially the same optical path for the light emitted from said plural-emitting means.

3. A device according to claim 1, wherein the light directed to the surface, being examined, is S-polarized with respect to the surface being examined and wherein the light, when it is incident on the surface, defines an angle not greater than 10 degrees relative to the surface.

4. A device according to claim 1, wherein said projecting means is arranged to cause said plural light-emitting means to emit the light substantially at one time.

5. A device according to claim 1, further comprising a second optical system effective to bring the surface, being examined, and the surface of said light receiving means into a substantially optically conjugate relation.

6. A position detecting device, comprising:
first light source means for projecting light onto the surface, being examined, along an inclined direction with respect to the surface being examined;
light receiving means for receiving light reflected from the surface, being examined, and for producing an electric signal corresponding to a position of reception of light;
second light source means for projecting light onto a reference position on said light receiving means, wherein the light from said second light source means is incident on said light receiving means without being reflected by the surface being examined;
means for actuating said first and second light source means, independently of each other; and
processing means for detecting positional deviation of the surface being examined, with respect to a predetermined reference plane, on the basis of the output of said light receiving means produced in response to the reception of the light reflected from the surface being examined and the output of said light receiving means produced in response to the reception of light from said second light source means.

7. A method for detecting a position of a surface of a resist on a wafer, said method comprising:
projecting a light beam containing S-polarized light onto the wafer obliquely in a direction of an angle not greater than 10 degrees with respect to the surface so as to form a light image on the surface;
re-focusing the S-polarized light reflected by the surface to form a re-focused light image on a position detector, said position detector being located at a position substantially optically conjugate with the surface; and
determining the position of the surface in accordance with the position of the re-focused light image.

8. A device for providing positional information of a wafer, coated with a resist, with respect to a direction of an exposure axis of an exposure system, said device comprising:
a light source for supplying light for different wavelengths;
an illumination optical system for projecting the light from said light source to the wafer, wherein the projected light is reflected by the wafer;
a light receiving optical system for receiving the reflected light from the wafer, said light receiving optical system including (i) a stop having an optical opening and (ii) an objective lens system for directing the reflected light from the wafer to said stop; and
means for receiving light from said opening of said stop and producing an electric signal corresponding to the positional information of the wafer.

9. A device according to claim 8, wherein said light source supplies beams of light of different wavelengths sequentially.

10. A device according to claim 8, wherein said light source supplies beams of light of different wavelengths simultaneously.

11. A device according to claim 8, wherein said stop and said objective lens system are so disposed that the distance between said stop and a principal point of said objective lens system is substantially equal to a focal length of said objective lens system.

* * * * *

UNITED STATES PATENT AND TRADEMARK OFFICE
CERTIFICATE OF CORRECTION

PATENT NO. : 5,162,642
DATED : November 10, 1992
INVENTOR(S) : TAKAHIRO AKAMATSU ET AL.

It is certified that error appears in the above-identified patent and that said Letters Patent is hereby corrected as shown below:

COLUMN 8

Line 50, "11 and 12" should read --i1 and i2--.

COLUMN 9

Line 53, "a that" should read --a true wafer position signal "VS'" which is equal to that--.

COLUMN 11

Line 11, "plural-emitting means." should read --plural light-emitting means.--.

Signed and Sealed this

Twenty-first Day of December, 1993

Attest:

BRUCE LEHMAN

Attesting Officer      Commissioner of Patents and Trademarks